US008567922B2

(12) United States Patent
Yamashita

(10) Patent No.: US 8,567,922 B2
(45) Date of Patent: Oct. 29, 2013

(54) PIEZOELECTRIC ACTUATOR UNIT AND METHOD FOR TESTING PIEZOELECTRIC ACTUATOR UNIT

(75) Inventor: Toru Yamashita, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 156 days.

(21) Appl. No.: 13/075,642

(22) Filed: Mar. 30, 2011

(65) Prior Publication Data
US 2011/0242225 A1 Oct. 6, 2011

(30) Foreign Application Priority Data
Mar. 31, 2010 (JP) ................. 2010-081625

(51) Int. Cl.
B41J 2/045 (2006.01)
H01L 41/047 (2006.01)
H01L 41/09 (2006.01)
G01R 29/22 (2006.01)

(52) U.S. Cl.
USPC ............. 347/68; 310/317; 310/366; 324/727

(58) Field of Classification Search
None
See application file for complete search history.

(56) References Cited

U.S. PATENT DOCUMENTS

| | | | |
|---|---|---|---|
| 6,190,006 B1 | 2/2001 | Kurashima et al. | |
| 7,434,914 B2 * | 10/2008 | Ito | 347/50 |
| 7,884,850 B2 * | 2/2011 | Kondoh | 348/207.2 |
| 2001/0052916 A1 | 12/2001 | Komuro | |
| 2005/0062807 A1 | 3/2005 | Ito et al. | |
| 2006/0170738 A1 | 8/2006 | Kato | |
| 2007/0236544 A1 | 10/2007 | Ito et al. | |
| 2008/0186342 A1 | 8/2008 | Ito et al. | |

FOREIGN PATENT DOCUMENTS

| | | |
|---|---|---|
| EP | 99683 A * | 2/1984 |
| JP | 10044416 | 2/1998 |
| JP | 10202876 | 8/1998 |
| JP | 11300956 | 11/1999 |
| JP | 2001-199064 | 7/2001 |
| JP | 2004-304027 | 10/2004 |
| JP | 2005/212238 | 8/2005 |
| JP | 2005/254721 | 9/2005 |
| JP | 2006-231913 | 9/2006 |
| JP | 2007/021854 | 2/2007 |
| JP | 2008-188887 | 8/2008 |
| JP | 2008-188888 | 8/2008 |
| JP | 2009-208256 | 9/2009 |

OTHER PUBLICATIONS

WIKIPEDIA Article: DIAC, pargraphs 1-2.*
Wikipedia Article:DIAC, Nov. 4, 2012, Paragraphs 1-2.*

* cited by examiner

Primary Examiner — Lisa M Solomon
(74) Attorney, Agent, or Firm — Frommer Lawrence & Haug LLP

(57) ABSTRACT

A piezoelectric actuator unit includes: a wiring board; a piezoelectric actuator which is provided with a piezoelectric layer, a plurality of individual electrodes provided to the piezoelectric layer, a common electrode which faces the plurality of individual electrodes sandwiching the piezoelectric layer between the common electrode and individual electrodes, and which is divided into a plurality of split electrodes, a plurality of individual contact points which are in conduction with the individual electrodes, and which are to be connected to the wiring board, and a plurality of reinforcing contact points which are connected to the wiring board to reinforce a connection with the wiring board; and a conduction mechanism which brings the plurality of split electrodes into conduction. Each of the split electrodes is in conduction with at least one of the reinforcing contact points.

13 Claims, 11 Drawing Sheets

PIEZOELECTRIC ACTUATOR UNIT AND METHOD FOR TESTING PIEZOELECTRIC ACTUATOR UNIT

CROSS REFERENCE TO RELATED APPLICATION

The present application claims priority from Japanese Patent Application No. 2010-081625, filed on Mar. 31, 2010, the disclosure of which is incorporated herein by reference in its entirety.

BACKGROUND OF THE INVENTION

1. Field of the Invention

The present invention relates to a piezoelectric actuator unit and a method for testing piezoelectric actuator unit, and more elaborately, to a piezoelectric actuator unit having a structure in which a connection between a piezoelectric actuator and a wiring board is reinforced by a reinforcing contact point, and a method for testing a connection of a reinforcing contact point which reinforces the connection between the piezoelectric actuator and the wiring board.

2. Description of the Related Art

In US Patent Application Publication No. 2006/0170738 (corresponds to Japanese Patent Application Laid-open No. 2006-231913), an ink-jet head which includes a piezoelectric actuator has been disclosed. The piezoelectric actuator shown in diagrams such as FIG. 4 of US Patent Application Publication No. 2006/0170738 includes a plurality of piezoelectric layers (piezoelectric sheets) stacked in a direction of thickness, a plurality of individual electrodes arranged on one surface of each of the piezoelectric layers, and Common electrodes which are arranged on the other surfaces of the piezoelectric layers, facing the plurality of individual electrodes, sandwiching the piezoelectric layers therebetween. A constraining sheet is stacked on an upper surface of the uppermost piezoelectric layer, and furthermore, a top sheet is stacked on an upper surface of the constraining sheet. Moreover, a large number of contact points (connecting terminals) which are in conduction with the individual electrodes and the common electrodes are formed on an upper surface of the piezoelectric actuator (an upper surface of the top sheet). The contact points are connected to a large number of substrate-side electrodes respectively, of a flexible printed circuit board (FPC) which is arranged to cover the upper surface of the piezoelectric actuator by solder. A signal which has been outputted from an IC mounted on the FPC is transmitted to wires on the FPC, and the individual electrodes and the common electrodes via the contact points connected to the FPC.

Moreover, in FIG. 10 of US Patent Application Publication No. 2006/0170738, an embodiment, in which reinforcing contact points which do not contribute to transmission of signals are provided on the upper surface of the piezoelectric actuator separately from the contact points which are in conduction with the individual electrodes and the common electrodes, has been disclosed. These reinforcing contact points, similar to the large number of contact points, are connected to electrodes (dummy electrodes which are not connected to the IC) provided on an FPC side by solder. A joining strength of the piezoelectric actuator and the FPC is improved by these reinforcing contact points, and the FPC is hardly exfoliated.

Defects of connections between the contact points for signal transmission of the piezoelectric actuator and the FPC are directly related to defects of signal transmission, and eventually, to defects of operation of the piezoelectric actuator. Therefore, regarding these contact points, non-destructive testing of connection of all the contact points and the FPC has hitherto been carried out generally by detecting the conduction electrically. However, since the reinforcing contact points which reinforce the joining of the piezoelectric actuator and the FPC are not for the purpose of signal transmission, the connection could not be tested by the non-destructive testing similar to the contact points for the signal transmission described above.

However, when the reinforcing contact points have been provided, the joint strength between the piezoelectric actuator and the FPC is designed on the assumption that these reinforcing contact points are provided. Accordingly, even for the reinforcing contact points, the testing of the connection with the FPC has been sought strongly.

SUMMARY OF THE INVENTION

An object of the present invention is to test the connection between the wiring board and the reinforcing contact points of the piezoelectric actuator in a piezoelectric actuator unit.

According to an aspect of the present invention, there is provided a piezoelectric actuator unit including: a wiring board; a piezoelectric actuator which is provided with a piezoelectric layer, a plurality of individual electrodes provided to the piezoelectric layer, a common electrode which faces the plurality of individual electrodes sandwiching the piezoelectric layer between the common electrode and individual electrodes, and which is divided into a plurality of split electrodes, a plurality of individual contact points which are in conduction with the individual electrodes, and which are to be connected to the wiring board, and a plurality of reinforcing contact points which are connected to the wiring board to reinforce a connection with the wiring board; and a conduction mechanism which brings the plurality of split electrodes into conduction, and each of the split electrodes is in conduction with at least one of the reinforcing contact points.

According to the aspect of the present invention, the common electrode is divided into the plurality of split electrodes, and the split electrodes are in conduction with the reinforcing contact points. Consequently, it is possible to test connection of the reinforcing contact points which are in conduction with the split electrodes, by polarizing portions of the piezoelectric layer between the split electrodes and the individual electrodes, and by figuring out the degree of polarization of the portions of the piezoelectric layer by measuring an electrostatic capacitance of the portions of the piezoelectric layer, in a state that the split electrodes are in non-conduction each other. Moreover, when the piezoelectric actuator is used after the connections of all the reinforcing contact points are judged to be favorable, by switching the state of non-conduction among the split electrodes to a state of conduction by a conduction mechanism, and by making the split electrodes function as one common electrode, it is possible to lower an electrical resistance of the common electrode.

DETAILED DESCRIPTION OF THE PREFERRED EMBODIMENTS

Next, an embodiment of the present invention will be described below. The embodiment is an example in which the present invention is applied to an ink-jet printer which includes an ink-jet head which jets droplets of an ink onto a recording paper.

Figure 1:
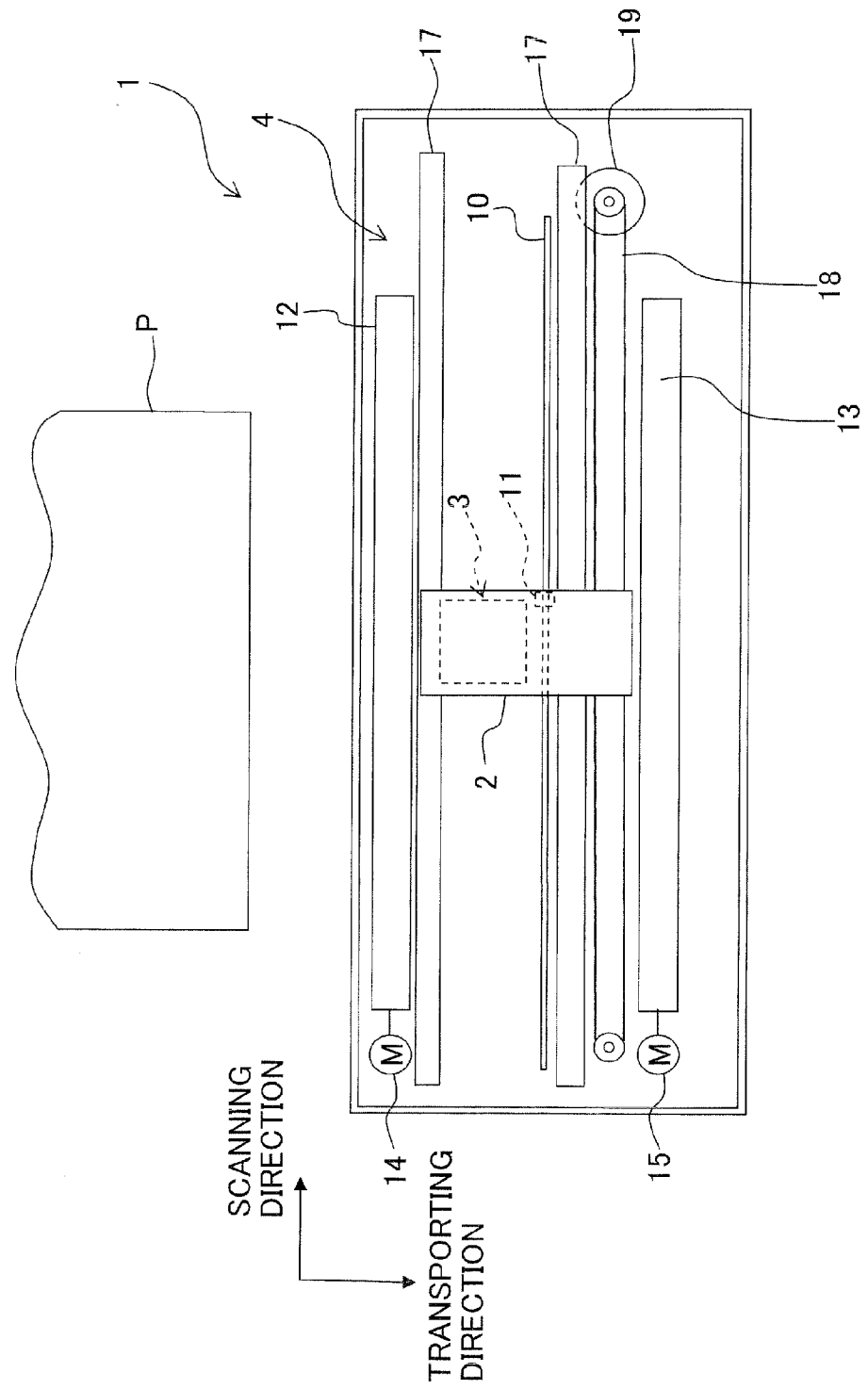
FIG. 1 is a schematic plan view of an ink-jet printer according to an embodiment of the present invention.

Firstly, a schematic structure of an ink-jet printer 1 (a liquid jetting apparatus) according to the present invention will be described below by referring to FIG. 1 and FIG. 2. As shown in FIG. 1, the ink-jet printer 1 includes a carriage 2 which is structured to be capable of reciprocating in a predetermined scanning direction (a left-right direction in FIG. 1), an ink-jet head 3 which is mounted on the carriage 2, a transporting mechanism 4 which transports a recording paper P in a transporting direction which is orthogonal to the scanning direction, and a control unit 5 which controls an operation of each portion of the ink-jet printer 1 (refer to FIG. 2).

The carriage 2 is structured to be capable of reciprocating along two guide shafts 17 extended in parallel in the scanning direction (the left-right direction in FIG. 1). Moreover, an endless belt 18 is linked with the carriage 2, and when the endless belt 18 is driven by a carriage driving motor 19, the carriage 2 moves in the scanning direction with running of the endless belt 18. The ink-jet printer 1 is provided with a linear encoder 10 having a large number of light transmission portions (slits) arranged at an interval in the scanning direction. Whereas, the carriage 2 is provided with a photosensor 11 of a transmission-type, having a light emitting element and a light receiving element. The ink-jet printer 1 identifies a current position in the scanning direction of the carriage 2 from a discrete value (frequency of detection) of the light transmission portion of the linear encoder 10 which the photosensor 11 has detected during the movement of the carriage 2.

The ink-jet head 3 is mounted on the carriage 2. The ink-jet head 3 includes a large number of nozzles 30 in a lower surface (rear surface side of the paper surface in FIG. 1) thereof (refer to diagrams from FIG. 3 to FIG. 6). The ink-jet head 3 is structured to jet an ink which has been supplied from an ink cartridge which is not shown in the diagram, from the large number of nozzles 30 onto the recording paper P which is transported downward in FIG. 1 (transporting direction) by the transporting mechanism 4.

The transporting mechanism 4 includes a paper feeding roller 12 which is arranged at an upstream side in a transporting direction with respect to the ink-jet head 3, and a discharge roller 13 which is arranged at a downstream side in the transporting direction with respect to the ink-jet head 3. The paper feeding roller 12 and the paper discharge roller 13 are driven to rotate by a paper feeding motor 14 and a paper discharge motor 15 respectively. The transporting mechanism 4 transports the recording paper P from an upper side in FIG. 1 to the ink-jet head 3 by the paper feeding roller 12, and discharges the recording paper P having an image and characters recorded thereon by the ink-jet head 3, to a lower side in FIG. 1 by the paper discharge roller 13.

Figure 2:
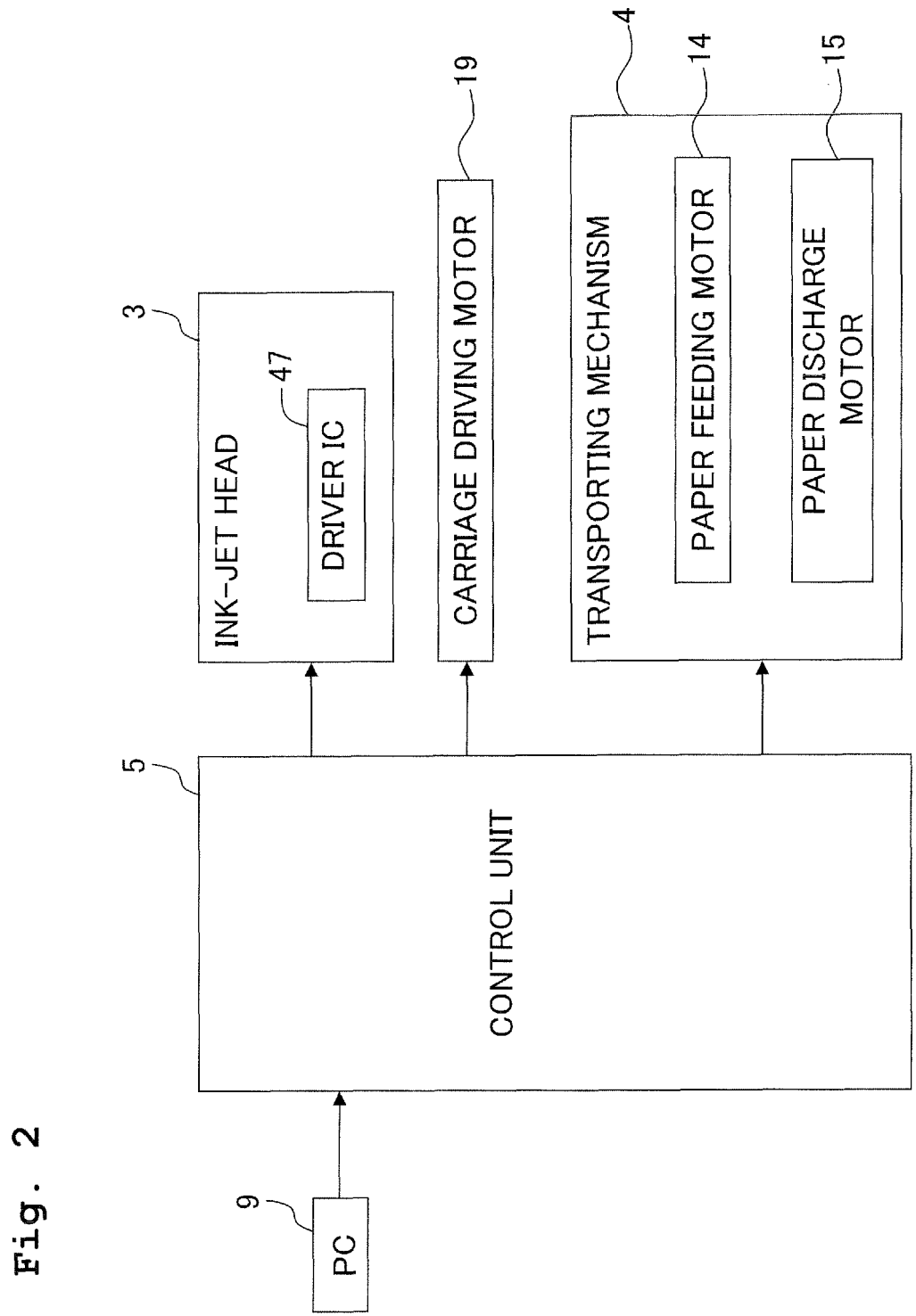
FIG. 2 is a block diagram showing schematically an electrical structure of the printer.

As shown in FIG. 2, the control unit 5, based on data related to an image and characters to be recorded, which has been inputted from a PC (personal computer) 9, controls the ink-jet head 3, the carriage driving motor 19 which drives the carriage 2, the paper feeding motor 14 and the paper discharge motor 15 of the transporting mechanism 4, and makes the ink-jet printer 1 record a desired image and characters on the recording paper P.

Figure 3:
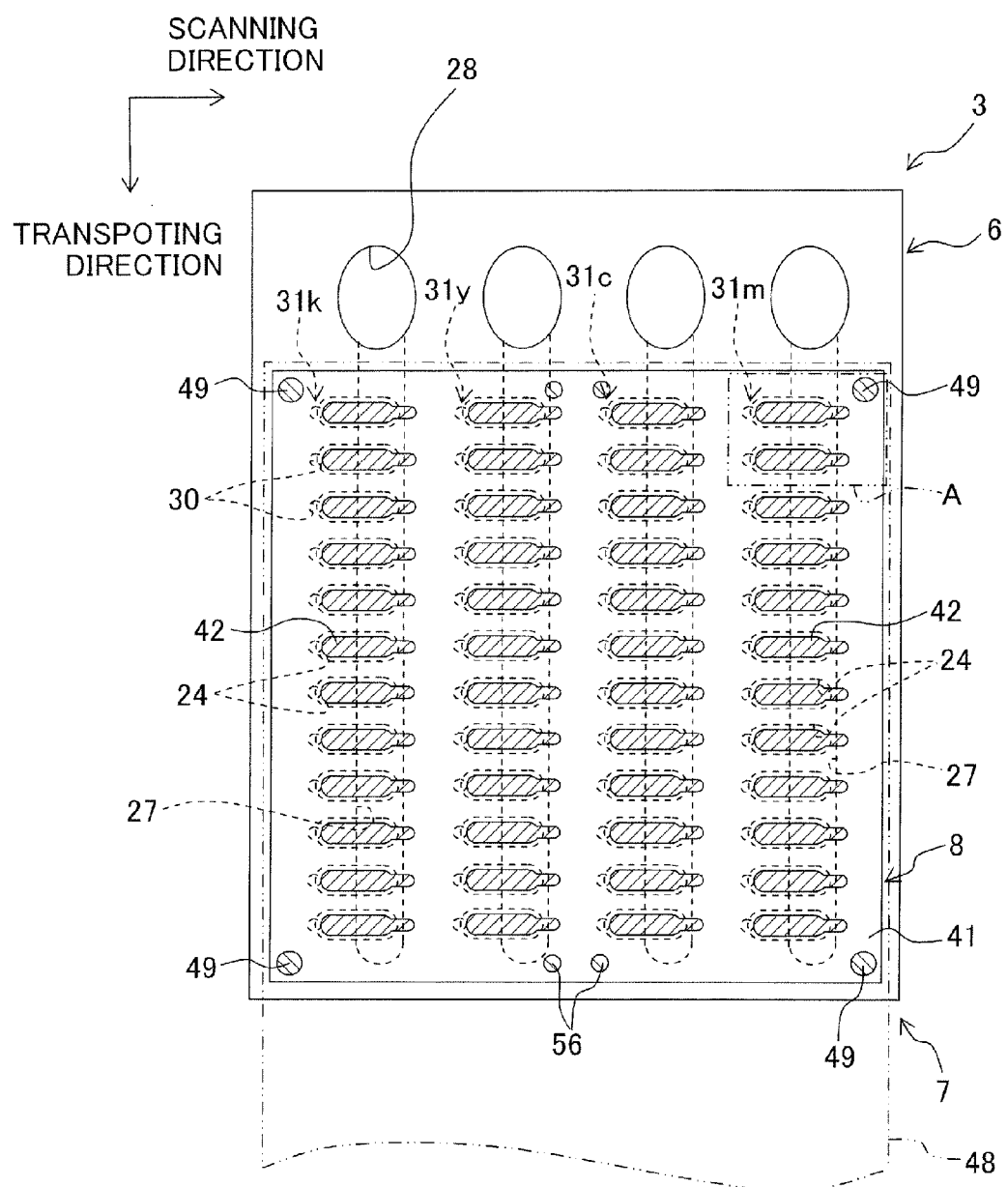
FIG. 3 is a plan view of an ink-jet head.
Figure 4:
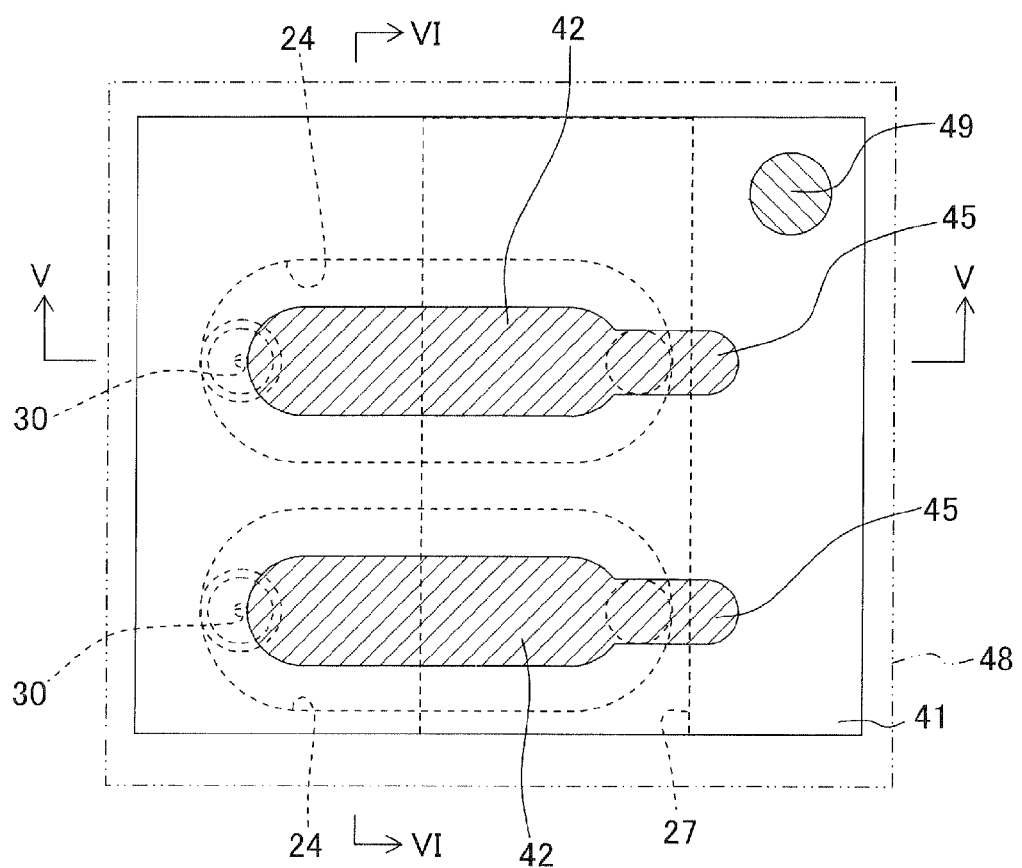
FIG. 4 is a partially enlarged view of an area A in FIG. 3.
Figure 5:
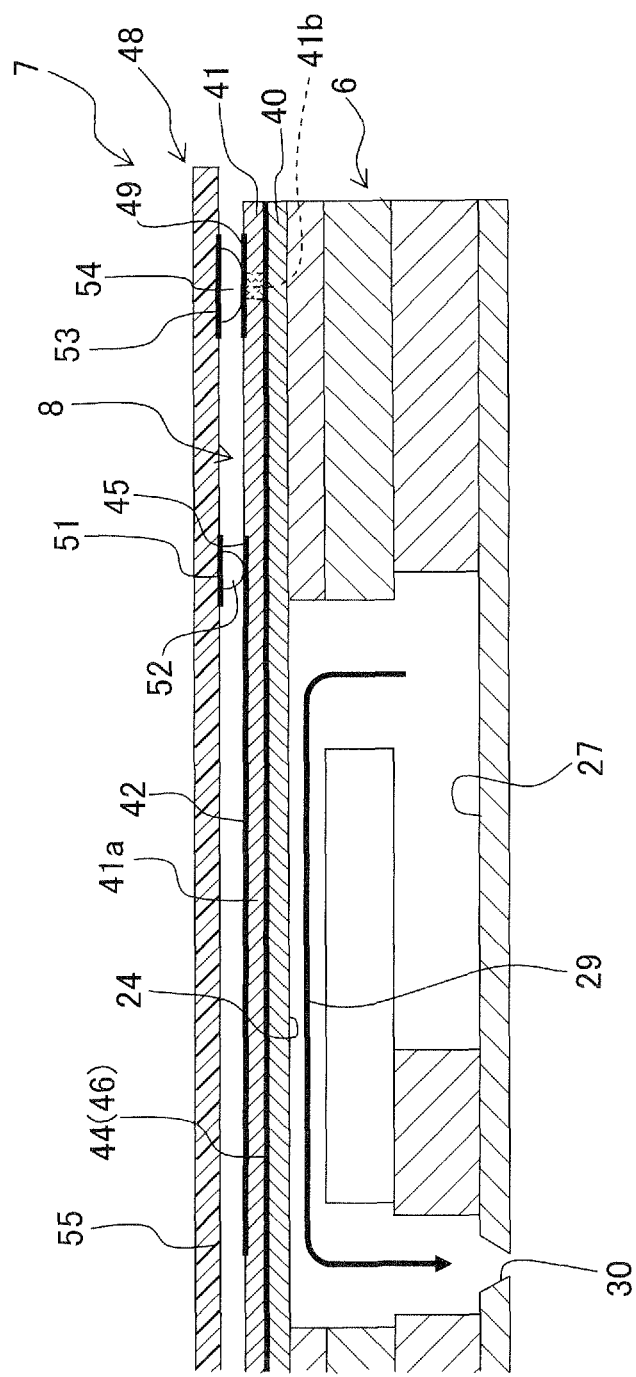
FIG. 5 is a cross-sectional view along a line V-V of FIG. 4.
Figure 6:
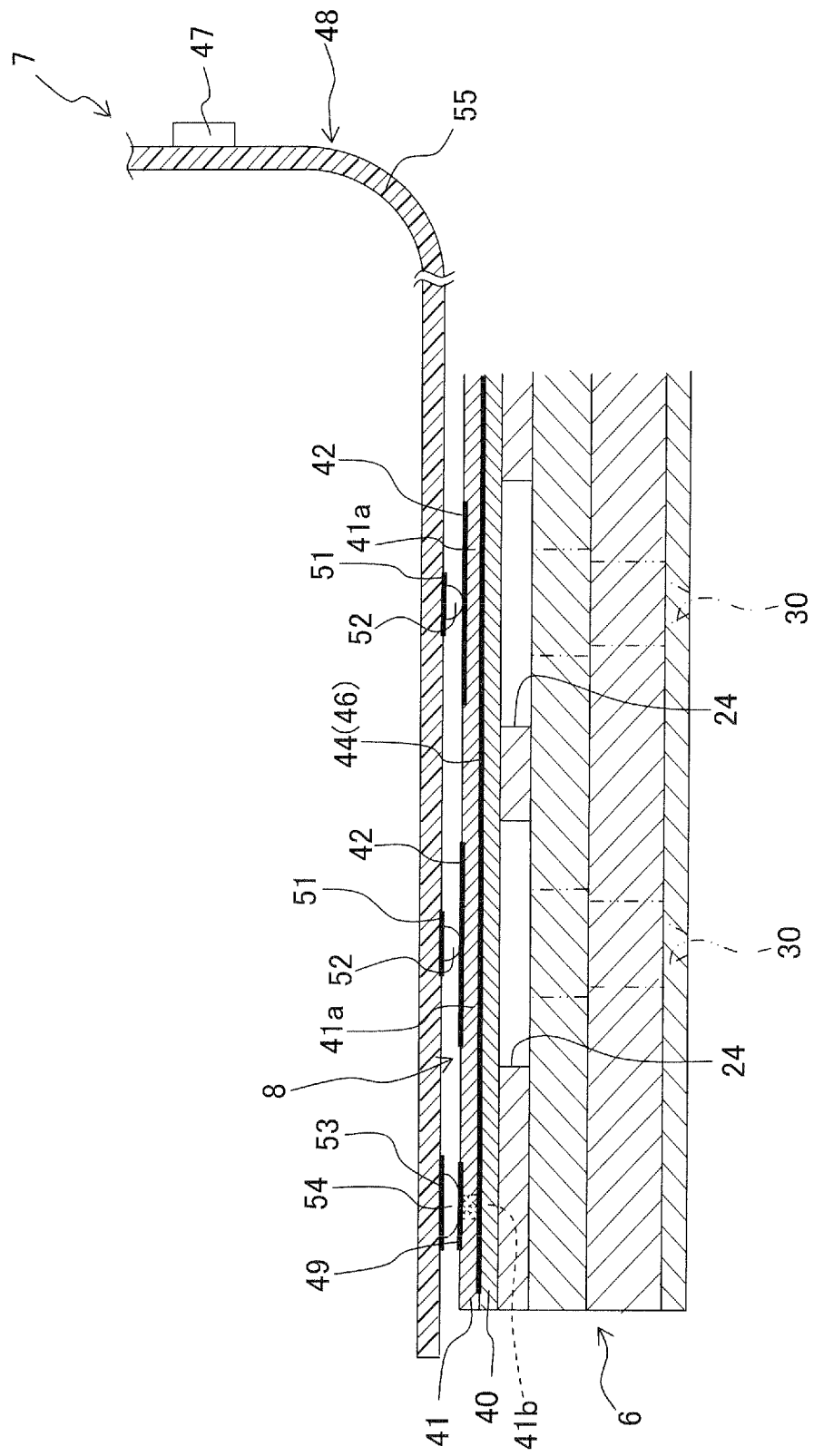
FIG. 6 is a cross-sectional view along a line VI-VI of FIG. 4.

Next, the ink-jet head 3 will be described below by referring to diagrams from FIG. 3 to FIG. 6. In FIG. 3 and FIG. 4, for making the diagrams easily understandable, a flexible printed circuit board 48 which is shown clearly in FIG. 5 and FIG. 6 is indicated by alternate long and two short dashes lines. As shown in diagrams from FIG. 3 to FIG. 6, the ink-jet head 3 includes a channel unit 6 in which ink channels including the nozzles 30 and pressure chambers 24, and a piezoelectric actuator unit 7 having a piezoelectric actuator 8 which applies a pressure to an ink inside each of the pressure chambers 24. As shown in diagrams from FIG. 3 to FIG. 6, the flexible printed circuit board (FPC) 48 is joined to an upper surface of the piezoelectric actuator 8.

As shown in FIG. 5 and FIG. 6, the channel unit 6 has a structure in which four plates are stacked, and the ink channels are formed at an interior of these four plates. The plurality of nozzles 30 is formed in a lower surface (rear surface side of the paper surface in FIG. 3) of the channel unit 6. As shown in FIG. 3, the plurality of nozzles 30 form four nozzle rows 31 ($31k$, $31y$, $31c$, and $31$) which are extended in the transporting direction and arranged to be side-by-side in the scanning direction. Inks of four colors namely black, yellow, cyan, and magenta are jetted from the nozzles 30 belonging to the four nozzle rows 31 ($31k$, $31y$, $31c$, and $31m$) respectively. Moreover, the plurality of pressure chambers 24 which communicate with the plurality of nozzles 30 respectively are formed in the channel unit 6, and the pressure chambers 24 are also arranged in four rows corresponding to four nozzle rows 31. Furthermore, four manifolds 27 which are extended in the transporting direction and which supply the inks of four colors namely black, yellow, cyan, and magenta to the four pressure chamber rows 31 are formed in the channel unit 6. The four manifolds 27 are connected to four ink supply ports 28 which are formed in an upper surface of the channel unit 6.

As shown in FIG. 5, inside the channel unit 6, the manifolds 27 which are in continuity with the ink supply ports 28 communicate with the pressure chambers 24, and furthermore, the pressure chambers 24 communicate with the nozzles 30 respectively. In other words, a plurality of individual ink channels 29 running from the manifolds 27 up to the nozzles 30 via the pressure chambers 24 are formed in the channel unit 6.

Next, the piezoelectric actuator unit 7 will be described below. The piezoelectric actuator unit 7 includes the piezoelectric actuator 8, the flexible printed circuit board (FPC) 48 which is joined to the upper surface of the piezoelectric actuator 8, and a driver IC 47 which is mounted on the FPC 48, and which drives the piezoelectric actuator 8.

As shown in diagrams from FIG. 3 to FIG. 6, the piezoelectric actuator 8 includes two piezoelectric layers 40 and 41 which are stacked on the upper surface of the channel unit 6 to cover the plurality of pressure chambers 24, a plurality of individual electrodes 42 which are arranged on an upper surface of the piezoelectric layer 41, and a common electrode 44 which is arranged between the two piezoelectric layers 40 and 41.

The two piezoelectric layers 40 and 41 are made of a piezoelectric material which is mainly composed of lead zirconium titanate (PZT) which is a solid solution of lead titanate and lead zirconate, and is a ferroelectric substance. The piezoelectric layers 40 and 41 have same rectangular planar shape. The two piezoelectric layers 40 and 41 which are stacked are joined to the upper surface of the channel unit 6 in a state of covering the plurality of pressure chambers 24. A portion of the piezoelectric layer (hereinafter, also called as "an active portion 41a") of the piezoelectric layer 41 at an upper side, which is sandwiched between the two types of electrodes namely the individual electrode 42 and the common electrode 44 is polarized in a thickness direction by a predetermined polarization voltage applied between the individual electrode 42 and the common electrode 44.

Figure 7:
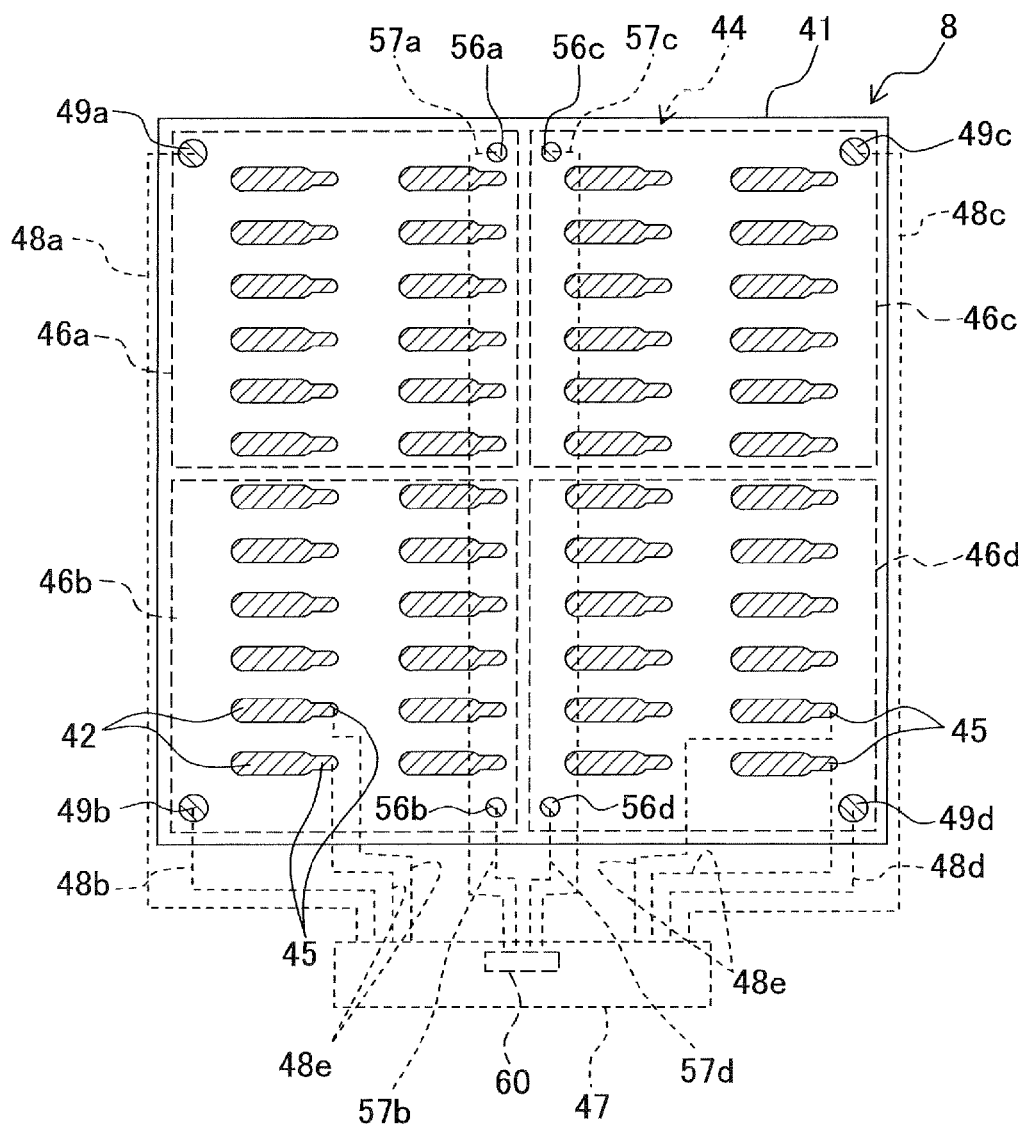
FIG. 7 is a top view of a piezoelectric actuator.

As shown in diagrams from FIG. 5 to FIG. 7, the individual electrodes 42 are arranged on the upper surface of the piezoelectric layer 41, in areas facing the plurality of pressure chambers 24 respectively. As shown in FIG. 3 and FIG. 4, each of the individual electrodes 42 has a substantially elliptical planar shape, slightly smaller than the pressure chamber 24, and is facing a central portion of the pressure chamber 24. Moreover, the plurality of individual electrodes 42 are arranged in four rows similar to the pressure chambers 24 communicating with the nozzles 30. A plurality of individual contact points 45 are drawn from end portions of the individual electrodes 42, in a longitudinal direction of the elliptical-shaped individual electrodes 42 respectively. As shown in FIG. 5 and FIG. 6, the plurality of individual contact points 45 are connected to a plurality of terminals 51 for individual electrodes of the FPC 48, which is to be arranged to cover the upper surface of the piezoelectric actuator 8, by a solder 52. The individual electrodes 42 and the driver IC 47 mounted on the FPC 48 are connected via wires 48e of the FPC 48 and the individual contact points 45. In FIG. 7, only a part of the wires 48e are shown for simplicity of the diagram.

Figure 8:
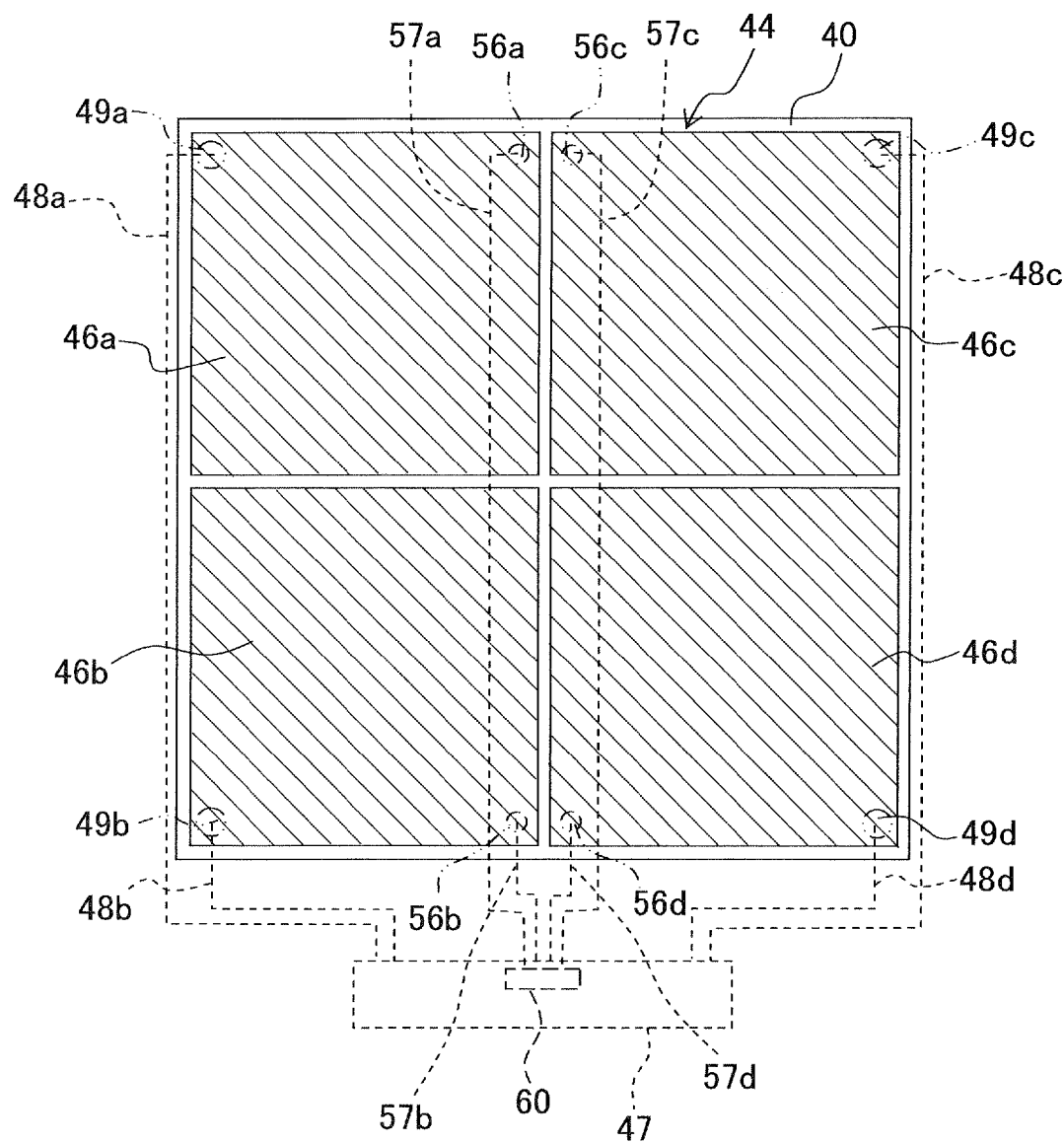
FIG. 8 is a top view of a piezoelectric actuator (top view of a piezoelectric layer on a lower side), in a state that a piezoelectric layer on an upper side is removed from the piezoelectric actuator in FIG. 7.

The common electrode 44 which is arranged between two piezoelectric layers 40 and 41 is formed to be spread over almost entire area of a lower surface (an upper surface of the piezoelectric layer 40 on the lower side) of the piezoelectric layer 41 on the upper side, and is facing the individual electrodes 42 sandwiching the piezoelectric layer 41 between the individual electrodes 42 and the common electrode 44. As shown in FIG. 7 and FIG. 8, the common electrode 44 is divided into four split electrodes 46 (46a, 46h, 46c, and 46d (hereinafter, "slit electrodes 46a to 46d")) each having a rectangular shape and almost same area. The split electrode 46a at an upper left in the diagram and the split electrode 46b at a lower left in the diagram are facing an upper-half portion and a lower-half portion in the diagram respectively of two rows on left side of the individual electrodes 42, corresponding to the nozzle rows 31k and 31y for inks of black and yellow colors (refer to FIG. 3). Moreover, the split electrode 46c at an upper right in the diagram and the split electrode 46d at a lower right in the diagram are facing an upper-half portion and a lower-half portion in the diagram respectively of two rows on right side of the individual electrodes 42, corresponding to the nozzle rows 31c and 31m for inks of cyan and magenta colors. As shown in FIG. 8, the four split electrodes 46a to 46d are separated, and are in a state of non-conduction mutually. However, at the time of use of the ink-jet printer 1, these four split electrodes 46a to 46d are let to be in a state of mutual conduction. A reason for this and a concrete structure thereof will be described later in detail.

As shown in FIG. 3 and FIG. 7, four reinforcing contact points 49 (49a, 49b, 49c, and 49d (hereinafter, "reinforcing contact points 49a to 49d")), each made of an electroconductive material, are formed on the upper surface of the piezoelectric layer 41 (the upper surface of the piezoelectric actuator 8) having the rectangular planar shape, at positions of four corners. As shown in FIG. 5 and FIG. 6, each of the four reinforcing contact points 49 is joined to the FPC 48 by a solder 54. Accordingly, a joining strength of the piezoelectric actuator 8 and the FPC 48 is improved, and an exfoliation of the FPC 48 is prevented.

Moreover, the four reinforcing contact points 49a to 49d are in conduction with the four split electrodes 46a to 46d respectively, which form the common electrode 44, and also function as contact points for the common electrode which connect the common electrode 44 and terminals for common electrode 53 of the FPC 48. Concretely, as shown in FIG. 5 and FIG. 6, a through hole 41h is formed in the piezoelectric layer 41, at a portion right below the each of the reinforcing contact points 49, and by an electroconductive material filled in the through hole 41b, each of the reinforcing contact points 49 and the split electrodes 46a to 46d positioned right below thereof are in conduction, respectively.

In such manner, the common electrode 44 is divided into four split electrodes 46a to 46d and the four reinforcing contact points 49a to 49d are in conduction with the four split electrodes 46a to 46d respectively, to function also as contact points for the common electrode which connect the FPC 48 and the four split electrodes 46. Accordingly, it is possible to test (by non-destructive testing) electrically the connection of the reinforcing contact points 49 and the FPC 48 which could hitherto not be tested. A method for testing the connection of the reinforcing contact points 49 and the FPC 48 will be described later in detail.

As shown in FIG. 3, the FPC 48 is joined to the upper surface of the piezoelectric actuator 8, and also is drawn horizontally from the piezoelectric actuator 8 in one of the directions (a downward direction in FIG. 3) in which the nozzles 30 are arranged, and furthermore, is drawn upward upon being bent as shown in FIG. 6. As shown in FIG. 5 and FIG. 6, the FPC 48 includes a substrate 55 formed of a flexible material such as polyimide, the plurality of terminals for individual electrodes 51 to be connected to the plurality of individual contact points 45, which are formed on a lower surface of the substrate 55, and four terminals for common electrode 53 which are to be connected to the four reinforcing contact points 49. Moreover, as shown in FIG. 6, the driver IC 47 is mounted on the substrate 55 of the FPC 48, and the plurality of terminals for the individual electrodes 51 and the four terminals for the common electrode 53 are connected to the driver IC 47 by wires (not shown in the diagrams) formed on the substrate 55. In FIG. 7 and FIG. 8, a state in which the plurality of individual contact points 45 of the piezoelectric actuator 8 and the four reinforcing contact points 49a to 49d (contact points for the common electrode), and the driver IC 47 are connected electrically via wires 48a, 48b, 48c, and 48d (hereinafter, "wires 48a to 48d") is shown in a simplified form by dashed lines. As shown in FIG. 7 and FIG. 8, the four wires 48a to 48d have different lengths according to positions at which the reinforcing contact points 49a to 49d are arranged. However, as it will be described later, at the time of polarizing in the thickness direction, the plurality of active portions 41a sandwiched between the individual electrodes 42 and the four split electrodes 46, it is necessary to apply a predetermined voltage to four split electrodes 46. Therefore, it is preferable to make a cross-sectional area of each of the wires 48a and 48c which are longer than the wires 48b and 48d to be greater than a cross-sectional area of each of the wires 48b and 48d, and to make an electrical resistance of the four wires 48a to 48d as uniform as possible. In FIG. 7, for simplifying the diagram, only a part of the connections of the plurality of individual contact points 45 (terminals for individual electrode) and the driver IC 47 are shown, and remaining large number of connections are not shown. Moreover, in FIG. 7 and FIG. 8, a state in which four contact points for conduction 56a, 56b, 56c, and 56d (hereinafter, "contact points for conduction 56a to 56d") to be in conduction with the four split electrodes 46a to 46d are connected to the drier IC 47 mounted on the FPC 48 via wires 57a, 57b, 57c, and 57d (hereinafter, "wires 57a to 57d") is also shown. The four contact points for conduction 56a to 56d will be described later in detail.

The driver IC 47 drives the piezoelectric actuator 8 based on a signal which has been inputted from the control unit 5 (refer to FIG. 2). Concretely, the driver IC 47 keeps an electrical potential of the common electrode 44 (four split electrodes 46) at a ground electrical potential all the time, and supplies drive signals having predetermined pulse waveforms selectively to the individual electrodes 42, and switches an electric potential of each of the individual electrodes between the ground electric potential and a predetermined driving electric potential corresponding to a pulse height. In such a manner, the driver IC 47 impresses an electric field in the portions of the piezoelectric layer (active portion 41a), which are between the individual electrodes 42 and the common electrode 44 and which have been polarized, in the thickness direction of the piezoelectric layer, thereby causing piezoelectric deformations in the active portions 41a.

Driving of the piezoelectric actuator 8 will be described below in further detail. When a drive signal is supplied to a certain individual electrode 42 from the driver IC 47, and a driving electric potential is applied to the individual electrode 42, an electric potential difference is developed between the individual electrode 42 to which the driving electric potential is applied and the common electrode 44 which is kept at the ground electric potential all the time, and an electric field in the thickness direction is impressed in the active portion 41a of the piezoelectric layer 41 sandwiched between the individual electrode 42 and the common electrode 44. Since the direction of the electric field is parallel to the direction in which the piezoelectric layer 41 is polarized, the active portion 41a contracts in a planar direction which is orthogonal to the thickness direction. Whereas, since no electric field is impressed in the piezoelectric layer 40 on the lower side and also the piezoelectric layer 40 on the lower side is in a state of being fixed to the upper surface of the channel unit 6, in accordance with the contraction of the piezoelectric layer 41 on the upper side in the planar direction, a portion, of the piezoelectric layer 40 on the lower side, covering one of the pressure chambers 24, is deformed to project toward the pressure chamber 24 (unimorph deformation). At this time, since a volume inside the pressure chamber 24 decreases, an ink pressure inside the pressure chamber 24 rises up and the ink is jetted from the nozzle 30 communicating with this pressure chamber 24.

The common electrode 44 is facing the large number of individual electrodes 42, and has been provided for driving (making piezoelectric deformation of) the active portion 41a together with these individual electrodes 42, and when a large number of active portions 41a are driven simultaneously, a substantial driving current flows through the common electrode 44. At this time, when an electrical resistance of the common electrode 44 is high, changes in electric potentials (ground electric potential–driving electric potential) of the individual electrodes 42 are delayed, or, the electric potential of the common electrode 44 which is to be kept at a common electric potential (the ground electric potential) essentially, fluctuates substantially instantaneously, thereby causing fluctuation in the ink pressure inside the pressure chambers 24, and eventually there are effects on liquid jetting characteristics of the nozzles 30. Therefore, it is preferable that the electrical resistance of the common electrode 44 is as low as possible.

In the embodiment, for testing the connection of the reinforcing contact points 49 which will be described later, the common electrode 44 has been divided into four split electrodes 46, but at the time of using the ink jet printer 1, these four split electrodes 46, by being brought into mutual conduction, function as one common electrode 44.

As shown in FIG. 3, FIG. 7, and FIG. 8, four contact points for conduction 56 (56a to 56d) are provided on the upper surface of the piezoelectric layer 41 at positions facing the four split electrodes 46, respectively. Although it is not shown in the diagram, these four contact points for conduction 56 also, similar to the abovementioned reinforcing contact points 49, are in conduction with the four split electrodes 46 by through holes (an electroconductive material in the through hole) formed in the piezoelectric layer 41 at positions right below thereof Moreover, the four contact points for conduction 56 are connected to the FPC 48, and furthermore, are connected to the driver IC 47 by the wires 57a to 57d on the FPC 48. It is possible to switch the four contact points for conduction 56, or in other words, conduction/non-conduction between the four split electrodes 46 by a switching circuit 60 (conduction mechanism) provided in the driver IC 47. At the time of using the ink-jet printer 1, the switching circuit 60 is ON, and the four split electrodes 46 are in mutual conduction. A circuit having any structure may be appropriate as the switching circuit 60, and, it is possible to use a circuit in which a bidirectional diode has been used for instance.

Figure 10:
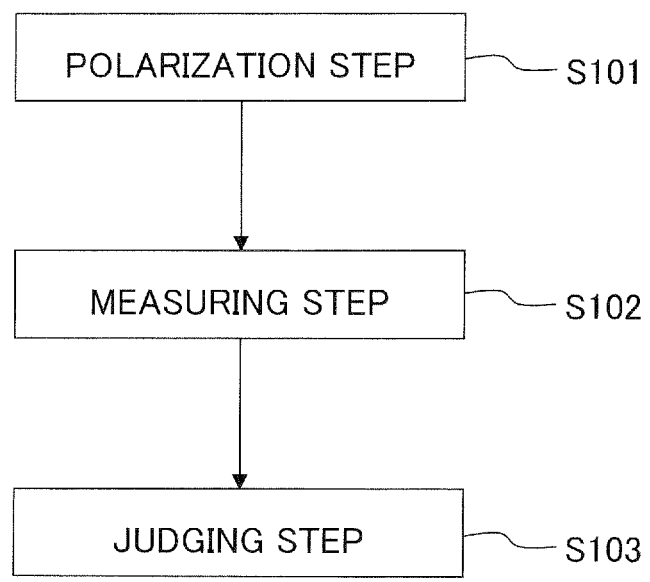
FIG. 10 is a flowchart explaining a method for testing a connection of an FPC and reinforcing contact points of the piezoelectric actuator.

Next, a method for testing connections of the contact points 45, reinforcing contact points 49, and the FPC 48 in the abovementioned ink-jet head 3 will be described by referring to a flowchart in FIG. 10.

To start with, the four reinforcing contact points 49 and the plurality of individual contact points 45 of the piezoelectric actuator 8 are connected to the four terminals for common electrode 53 and the plurality of terminals for individual electrodes 51 of the FPC 48, and the plurality of individual electrodes 42 and the four split electrodes 46 are connected to the driver IC 47 via the FPC 48. Moreover, all the four split electrodes 46 are let to be in a state of non-conduction by the switching circuit 60. In this state, a predetermined polarization voltage is applied between the plurality of individual electrodes 42 and the four split electrodes 46. This polarization voltage, in general, is a voltage greater than a driving voltage of the actuator (abovementioned electric potential difference between the driving electric potential and the ground electric potential). Accordingly, the plurality of active portions 41a of the piezoelectric layer 41, which are sandwiched between the individual electrodes 42 and the four split electrodes 46 are polarized in the thickness direction, and desired piezoelectric characteristics are achieved (step 5101; polarization step).

The active portion 41a which is formed by the piezoelectric layer 41 which is an insulating material, and by being sandwiched between the individual electrode 42 and the common electrode (split electrode 46) can be considered as some type of a condenser having a certain electrostatic capacitance. Moreover, when the polarization process described above is carried out, piezoelectric characteristics of the active portion 41a are improved, and also the electrostatic capacitance rises up. In other words, a value of the electrostatic capacitance can be said to be a parameter indicating the piezoelectric characteristics. Therefore, after the polarization step, the electrostatic capacitance of each of the plurality of active portions 41a is to be measured (S102: measuring step).

When there is a defect of connection between the individual contact point 45 and the FPC 48, or between the reinforcing contact point 49 (contact point for common electrode) and the FPC 48, no sufficient voltage is applied to the active portion 41a which is to be polarized by an electrode which is in conduction with the contact point having such defect of connection. Therefore, polarization process has been insufficient and a value of the electrostatic capacitance measured at the measuring step becomes lower than a value of the electrostatic capacitance when a normal polarization process has been carried out. Accordingly, when the value of the electrostatic capacitance for even one of the plurality of active portions 41a is lower than a predetermined value of the electrostatic capacitance when the normal polarization process is carried out, a judgment that the connections between the contact points and the FPC 48 are fault is made (S103: judging step).

When there is a defect of connection at a certain individual contact point 45, the electrostatic capacitance only for one active portion 41a which is to be polarized by an individual electrode 42 which is in conduction with the certain individual contact point 45 indicates an abnormal value. Whereas, when there is a defect of connection at a certain reinforcing contact point 49, the electrostatic capacitance for all of the plurality of active portions 41a which are to be polarized by a split electrode 46 which is in conduction with the certain reinforcing contact point 49 indicates an abnormal value. Consequently, depending on the active portions 41a in which the electrostatic capacitance is abnormal, it is possible to identify the individual contact point 45 or the reinforcing contact point 49 at which there is a defect of connection. However, when there is a defect of connection at any one contact point irrespective of a type of the contact point, and when there is an active portion 41a for which the polarization process is insufficient, such ink-jet head 3 is not appropriate for use. Therefore, identifying a contact point at which there is a defect of connection is not so significant.

Moreover, at the judging step, when the electrostatic capacitance of all the active portions 41a is indicated to be a normal value, a judgment is made that connections at all the individual contact points 45 and all the reinforcing contact points 49 are favorable, and the four split electrodes 46 are to be brought into mutual conduction by the switching circuit 60. Accordingly, it is possible to make the four split electrodes 46 function as one common electrode 44, and to lower the electrical resistance of the common electrode 44 as compared to a case in which the four split electrodes 46 are to be used independently.

In the embodiment described above, the common electrode 44 have been divided into four split electrodes 46, and four reinforcing contact points 49 have been in conduction with the four split electrodes 46 and function as contact points for the common electrode. Moreover, after the polarization process has been carried out by applying a predetermined polarization voltage to the active portions 41a sandwiched between the split electrodes 46 and the individual electrodes 42, the electrostatic capacitance of each of the active portions 41a is measured. By figuring out the degree of polarization of the active portions 41a from the value of the electrostatic capacitance which has been measured, it is possible to test the connections of the reinforcing contact points 49.

Next, modified embodiments in which various modifications are made in the embodiment will be described below.

Same reference numerals are used for components having a structure similar to the embodiment, and the description of such components is omitted.

In the embodiment, the switching circuit 60 inside the driver IC 47 has been bringing the four split electrodes 46 into mutual conduction by being ON all the time during the use of the ink-jet printer 1. However, depending on a status of use of the ink-jet printer 1, it is also possible to let the four split electrodes 46 into non-conduction by putting the switching circuit 60 OFF.

Figure 9:
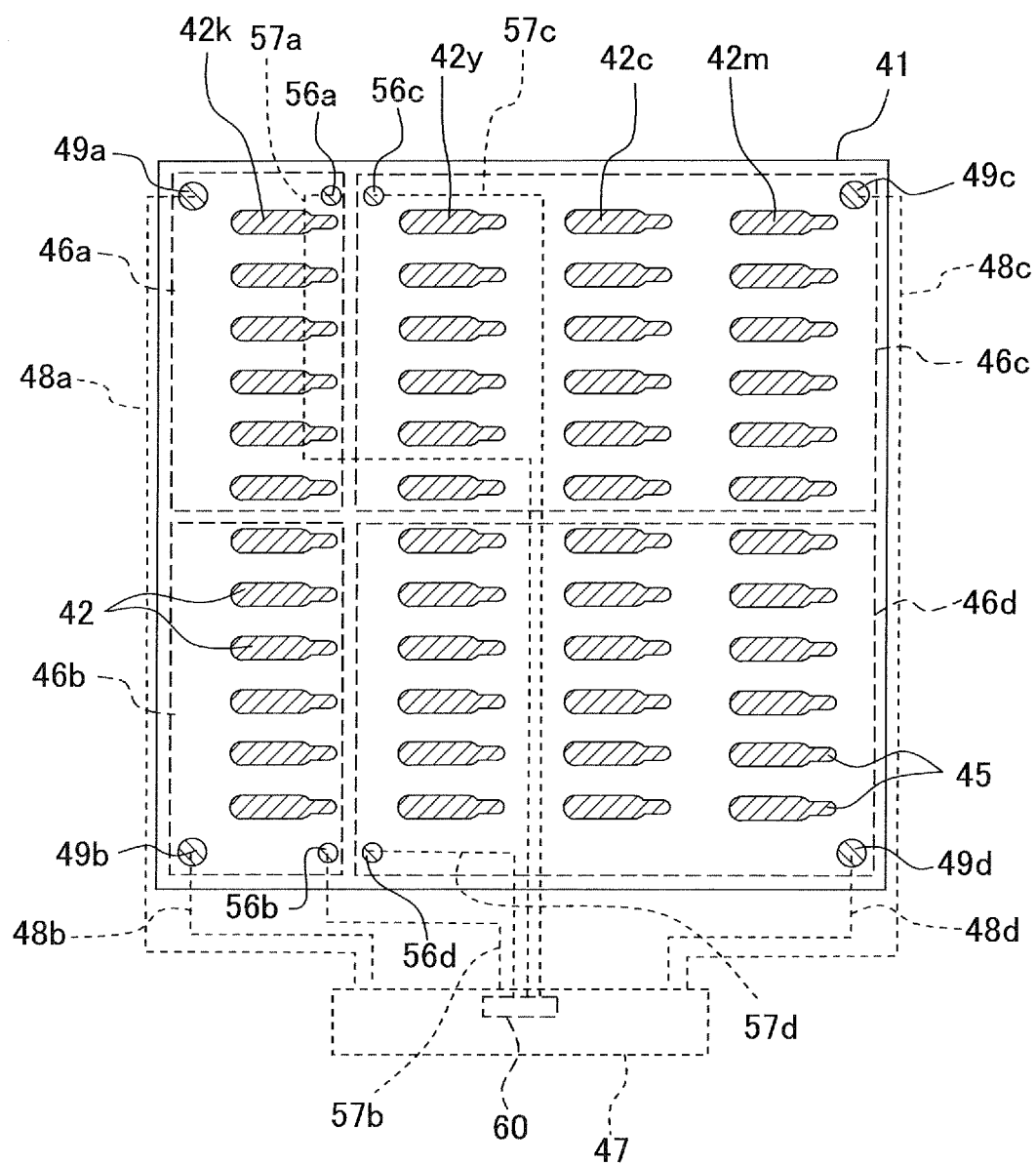
FIG. 9 is a top view of a modified embodiment corresponding to FIG. 7.

For instance, a case, in which the split electrodes 46 are divided according to the type of ink, will be described below by referring to FIG. 9. In FIG. 9, the wires 48e of the embodiment are omitted for simplicity of the diagram. The two split electrodes 46a and 46b having smaller areas, on a left side in the diagram out of the four split electrodes 46 shown in FIG. 9, are common electrodes for black ink, corresponding to the nozzle row 31k which jets the black ink (facing only the individual electrode 42k for black ink). Moreover, the two split electrodes 46c and 46d having greater areas, on a right side in the diagram are common electrodes for color inks, corresponding to the nozzle rows 31y, 31c, and 31m which jet the inks of three colors (yellow, cyan, and magenta) (facing only the individual electrodes 42y, 42c, and 42m for color inks).

In a printing such as a text printing, only the black ink is used, and color inks are not used. In such a case, for jetting the ink (black ink) only from the nozzle row 31k, when a drive signal has been supplied to the individual electrode 42k for the black ink from the driver IC 47, sometimes, an electric potential of the two split electrodes 46a and 46b facing the individual electrode 42k for the black ink, sandwiching the active portion 41a, fluctuates instantaneously with respect to the ground electric potential. At this time, when the four split electrodes 46a to 46d are in mutual conduction, the fluctuation in the electric potential developed in the split electrodes 46a and 46b for the black ink is transmitted up to the split electrodes 46c and 46d for the color inks, and an unnecessary voltage is applied to the active portions 41a, which drives the nozzle rows 31y, 31c, and 31m for the color inks (cross-talk). Although the unnecessary voltage which is applied is small as compared to a driving voltage which is to be applied for jetting the color inks, depending on the degree of the voltage, there is a possibility that the color ink which is not supposed to be jetted during the text printing is jetted.

Therefore, in a case of jetting the ink only from the nozzle row 31k for the black ink and not jetting the ink from the nozzle rows 31y, 31c, and 31m for the color inks, the switching circuit 60 inside the driver IC 47 switches the split electrodes 46a and 46b for the black ink and the split electrodes 46c and 46d for the color ink to non-conduction. Accordingly, it is possible to prevent the fluctuation in the electric potential from being transmitted to the split electrodes 46c and 46d for the color inks. In a case of using both the black ink and the color inks, the switching circuit 60 has to bring the four split electrodes 46a to 46d into mutual conduction similar to the embodiment. Furthermore, by dividing the split electrodes 46c and 46d for the color inks into three namely, a split electrode for yellow ink, a split electrode for cyan ink, and a split electrode for magenta ink, and letting them in non-conduction for each color, it is possible to prevent a cross-talk among different colors.

As shown in FIG. 7, in the embodiment, the switching circuit 60 which brings the four split electrodes 46 into mutual conduction, has been provided inside the driver IC 47 mounted on the FPC 48. In this case, the switching circuit 60 is connected to the split electrodes 46 via the wires of the FPC 48, the contact points for conduction 56, and the electroconductive material in the through hole of the piezoelectric layer 41. Therefore, there is a possibility of an increase in an electric resistance from the split electrodes 46 up to the switching circuit 60 (in other words, an electrical resistance of a conduction mechanism which brings the split electrodes 46 into conduction). Consequently, from a point of view of making the electrical resistance between the split electrodes 46 as small as possible, the switching circuit 60 may be provided on a side of the piezoelectric actuator 8.

For instance, the switching circuit 60 may be provided on the upper surface of the piezoelectric actuator 8 (the piezoelectric layer 41 on the upper side). In this case, upon the four electrodes for conduction being drawn from the four split electrodes 46 up to the upper surface of the piezoelectric actuator 8 via the through hole, the switching circuit 60 on the upper surface of the piezoelectric actuator 8 switches to the conduction/non-conduction between the four electrodes for conduction (four split electrodes 46). Moreover, the switching circuit 60 may be provided on the same plane as of the four split electrodes 46 (a lower surface of the piezoelectric layer 41 on the upper side or an upper surface of the piezoelectric layer 40 on the lower side).

Figure 11:
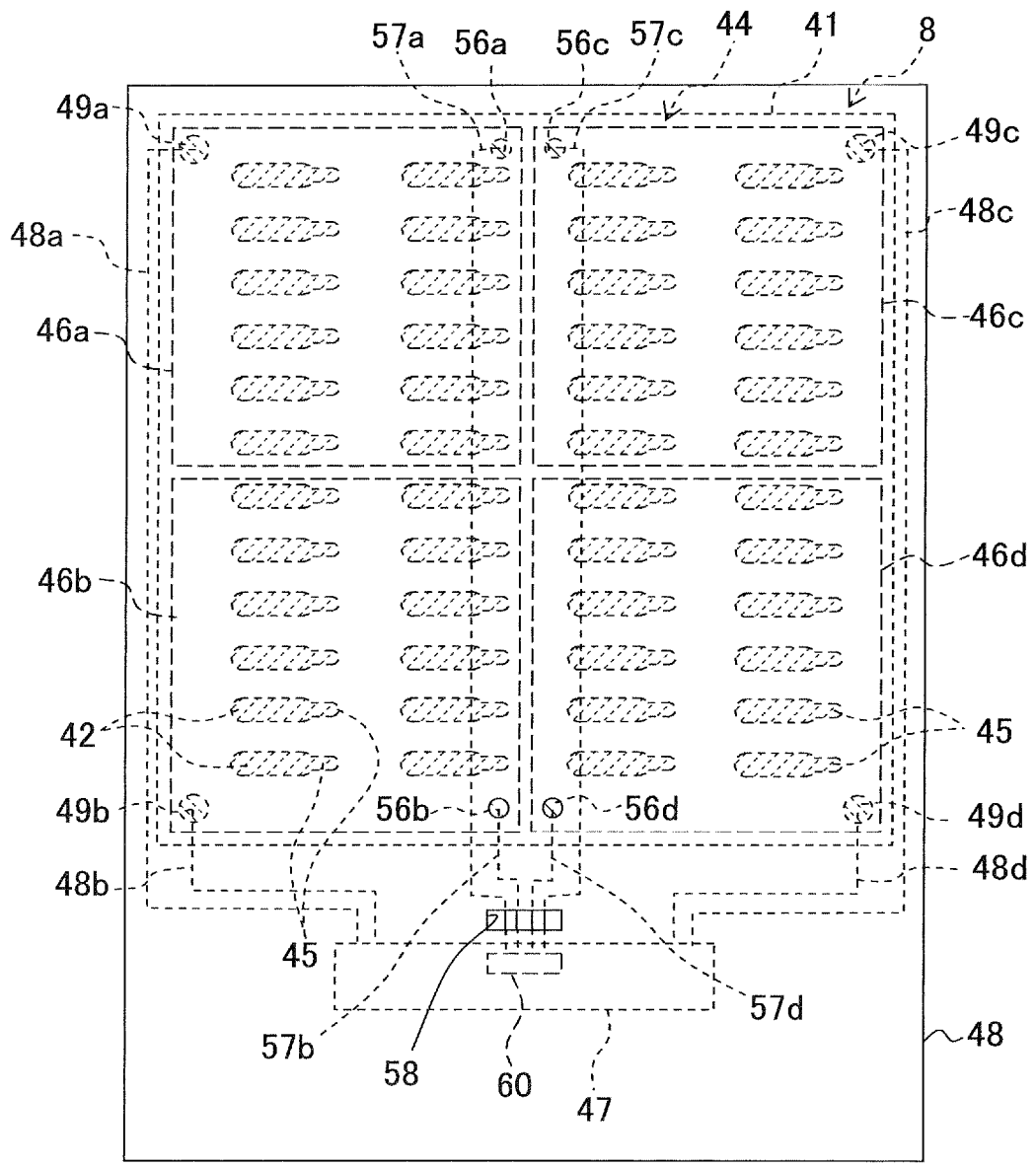
FIG. 11 is a top view of a modified embodiment.

The conduction mechanism which brings the four split electrodes 46 into conduction is not restricted to a switch which is capable of switching to conduction/non-conduction. For instance, the four split electrodes 46 may be let to be in non-conduction at the time of testing the connection of contact points, and after completion of the testing, the four split electrodes 46 may be brought into mutual conduction by adhering a solder or an electroconductive material in the form of a paste to the four split electrodes 46. For example, as shown in FIG. 11, an opening 58 may be formed on the FPC 48 in the vicinity of the driver IC 47 so that the wires 57a to 57d are exposed to a surface of the FPC 48 not facing the piezoelectric actuator 8 through the opening 58, and after the completion of the testing, the opening 58 may be filled with the solder or the electroconductive material so that the four split electrodes 46 are brought into conduction with each other. In FIG. 11, the wires 48e of the embodiment are omitted for simplicity of the diagram. In this case, it is possible to prevent the solder or the electroconducitve material from flowing out of the opening 58 and to prevent the wires 57a to 57d from being brought into contact with the other wires 48a to 48e in the FPC 48. In this case, unlike the switching circuit 60 in the embodiment, at the time of use of the ink jet printer 1, it is not possible to let the four split electrodes 46 in non-conduction once again, and the ink-jet printer 1 is used in a state of the four split electrodes 46 in conduction all the time.

In the embodiment, the four reinforcing contact points 49 have been provided at four corners on the upper surface of the piezoelectric actuator 8 to be joined to the FPC 48. However, the positions, the number, or the shape of the reinforcing contact points 49 are not restricted to those in the embodiment. Regarding the positions of the reinforcing contact points 49, since the reinforcing contact points 49 are to be provided with the main object of preventing exfoliation of the FPC 48, it is effective that the reinforcing contact points 49 are arranged on an edge portion of the upper surface of the piezoelectric actuator 8 which is to be joined to the FPC 48. In the embodiment, for being able to test the connection of each of the reinforcing contact points 49, the split electrodes 46 have been associated on one-to-one basis with the reinforcing contact points 49, and the number of the split electrodes 46 has been same as the number of reinforcing contact points 49. For instance, when ten reinforcing contact points 49 are provided, the common electrode 44 is to be divided into ten (the number of split electrodes 46 is ten). However, two or more reinforcing contact points may be in conduction with one split electrode. In this case, from a point of view of testing the connection of each reinforcing contact point and the FPC, it is preferable that the two or more reinforcing contact points are arranged to be separated mutually.

An application example of the present invention has been described above by citing an example of a piezoelectric actuator of an ink-jet head. However, the application of the present invention is not restricted to a field of ink jet printers, and the present invention is applicable also to a piezoelectric actuator which is to be used in a technical field other than the field of ink-jet printers.

What is claimed is:

1. A piezoelectric actuator unit comprising:
 a wiring board;
 a piezoelectric actuator which is provided with:
  a piezoelectric layer;
  a plurality of individual electrodes provided to the piezoelectric layer;
  a common electrode which faces the plurality of individual electrodes sandwiching the piezoelectric layer between the common electrode and individual electrodes and which is comprised of a plurality of physically distinct split electrodes;
  a plurality of individual contact points which are in conduction with the individual electrodes and which are to be connected to the wiring board; and
  a plurality of reinforcing contact points which are to be connected to the wiring board to reinforce a connection with the wiring board; and
 a conduction mechanism which brings the split electrodes into conduction,
 wherein each of the split electrodes is in conduction with at least one of the reinforcing contact points.

2. The piezoelectric actuator unit according to claim 1;
 wherein the common electrode is divided into a number of split electrodes same as a number of the plurality of reinforcing contact points, and each of the split electrodes is in conduction with one of the reinforcing contact points.

3. The piezoelectric actuator unit according to claim 2;
 wherein the conduction mechanism includes a switch which switches conduction and non-conduction of the split electrodes.

4. The piezoelectric actuator unit according to claim 3;
 wherein the switch is a circuit in which a bidirectional diode is used.

5. The piezoelectric actuator unit according to claim 3, further comprising:
 a driver which is mounted on the wiring board and which drives the piezoelectric actuator, wherein the switch is mounted on the driver.

6. The piezoelectric actuator unit according to claim 3;
 wherein the piezoelectric actuator drives a liquid jetting unit including:
  a first nozzle from which first liquid is jetted; and
  a second nozzle from which second liquid different from the first liquid is jetted;
 wherein the individual electrodes include:
  a first individual electrode for jetting the first liquid from the first nozzle; and
  a second individual electrode for jetting the second liquid from the second nozzle;

wherein the split electrodes include:
- a first split electrode which faces only the first individual electrode; and
- a second split electrode which faces only the second individual electrode; and wherein, when one of the first liquid and the second liquid is to be jetted from only one of the first nozzle and the second nozzle, the switch switches the first split electrode and the second split electrode into non-conduction.

7. The piezoelectric actuator unit according to claim 2;
wherein the piezoelectric actuator further includes a plurality of conduction contact points which are connected to the wiring board, and which bring the split electrodes into conduction.

8. The piezoelectric actuator unit according to claim 7;
wherein the individual contact points, the reinforcing contact points, and the conduction contact points are provided on one surface of the piezoelectric actuator, and the wiring board is arranged to cover the one surface of the piezoelectric actuator.

9. The piezoelectric actuator unit according to claim 8;
wherein the number of the split electrodes is same as the number of the conduction contact points and each of the split electrodes is in conduction with one of the conduction contact points.

10. The piezoelectric actuator unit according to claim 8;
wherein the one surface of the piezoelectric actuator is rectangular shaped, and the reinforcing contact points are provided at four corners of the one surface of the piezoelectric actuator.

11. The piezoelectric actuator unit according to claim 10;
wherein each of the split electrodes is in conduction with at least one of the reinforcing contact points via an electroconductive material which has been filled in a through hole formed in the piezoelectric layer.

12. A method for testing piezoelectric actuator unit as defined in claim 1, comprising:
- polarizing a plurality of portions of the piezoelectric layer sandwiched between each of the split electrodes and the individual electrodes by applying a predetermined polarization voltage between each of the split electrodes and the individual electrodes, from the circuit substrate, in a state that all of the split electrodes are in non-conduction;
- measuring an electrostatic capacitance of each of the portions of the piezoelectric layer; and
- judging connection state of each of the reinforcing contact points which is in conduction with one of the split electrodes, based on the electrostatic capacitance of each of the portions of the piezoelectric layer corresponding to one of the split electrodes.

13. The method for testing piezoelectric actuator unit according to claim 12;
wherein, when the electrostatic capacitance of each of the portions of the piezoelectric layer which has been measured is not less than a predetermined value, the connection of each of the reinforcing contact points is judged to be favorable, and the split electrodes are brought into conduction each other.

* * * * *